United States Patent [19]

Harrold et al.

[11] 4,158,169
[45] Jun. 12, 1979

[54] CORONA TESTING APPARATUS INCLUDING ACOUSTIC WAVEGUIDES FOR TRANSMITTING ACOUSTIC EMISSIONS FROM ELECTRICAL APPARATUS

[75] Inventors: Ronald T. Harrold; Allan I. Bennett, both of Murrysville, Pa.

[73] Assignee: Westinghouse Electric Corp., Pittsburgh, Pa.

[21] Appl. No.: 858,054

[22] Filed: Dec. 6, 1977

[51] Int. Cl.² ............... G01R 31/08; G01R 31/12
[52] U.S. Cl. ........................................ 324/52; 324/54
[58] Field of Search ................ 324/52, 54, 72, 96, 324/126, 127; 73/40.5 A

[56] References Cited

U.S. PATENT DOCUMENTS

| 2,402,544 | 6/1946 | Foulds | 324/127 X |
| 3,331,023 | 7/1967 | Adkins et al. | 324/127 |
| 3,505,597 | 4/1970 | Cronin et al. | 324/72 |
| 3,597,683 | 8/1971 | Saito et al. | 324/96 |
| 3,612,992 | 10/1971 | Cronin | 324/52 |
| 3,622,872 | 11/1971 | Boaz | 324/52 |
| 3,678,339 | 7/1972 | Sun et al. | 333/72 X |
| 3,777,189 | 12/1973 | Skinner et al. | 333/30 R |

FOREIGN PATENT DOCUMENTS

933646  9/1973  Canada ................................. 73/40.5 A

Primary Examiner—Gerard R. Strecker
Attorney, Agent, or Firm—D. R. Lackey

[57] ABSTRACT

Apparatus for detecting and locating corona discharges within the tank of an electrical apparatus. Acoustic waveguides are disposed within a tank of an electrical apparatus, with each having one end situated in proximity with a portion of the electrical apparatus to transmit acoustic emissions from the source of a corona or partial discharge to acoustic sensors located at remote locations.

10 Claims, 8 Drawing Figures

CORONA TESTING APPARATUS INCLUDING ACOUSTIC WAVEGUIDES FOR TRANSMITTING ACOUSTIC EMISSIONS FROM ELECTRICAL APPARATUS

CROSS-REFERENCE TO RELATED APPLICATIONS

Certain subject matter shown herein is claimed in co-pending application Ser. No. 858,034, filed Dec. 6, 1977, in the name of R. Harrold, which is assigned to the assignee of the present application.

BACKGROUND OF THE INVENTION

1. Field of the Invention

This invention relates, in general, to electrical apparatus and, more specifically, to the detection and location of the source of corona discharges within such apparatus.

2. Description of the Prior Art

Corona testing of high voltage, fluid-filled electrical apparatus, such as transformers, is desirable, as it may locate weak points or faults in the insulation system which may cause partial breakdown of the insulation. Corona testing thus may locate incipient faults which allow the apparatus to pass conventional tests, but which may cause complete breakdown of the insulation at some future time.

The corona test must not only indicate the presence of corona in the fluid-filled apparatus, but it should provide some means for pinpointing its exact location. A typical prior art corona testing method for detecting and locating corona uses the electrical signal provided by the corona discharge and a signal responsive to the mechanical vibrations produced in the insulating fluid by pressure changes in the fluid induced by the corona discharge. The electrical signal is used to trigger the horizontal sweep of a cathode ray oscilloscope, and the mechanical vibrations are picked up by a suitably located mechanical to electrical transducer which provides an electrical output signal to the vertical deflection terminal of the oscilloscope. The time between the start of the sweep and the start of the vertical deflection indicates the distance from the corona discharge to the pickup of the transducer. Moving the transducer and repeating the sequence allows the approximate location of the corona discharge to be identified by triangulation.

As shown in U.S. Pat. Nos. 3,505,597; 3,612,992 and 3,728,619, all of which are assigned to the assignee of the present application, the acoustic sensors or mechanical to electrical transducers commonly used for the detection and location of internal corona discharges are mounted on the exterior surface of the steel tanks of the fluid-filled electrical apparatus. The acoustic sensors are mounted externally on the tank due to the high voltages involved during testing and actual operation of the electrical apparatus which discourages the internal location of such sensors which are at ground potential. Depending upon the thickness of the steel tank wall, the loss of sensitivity between an external and internal sensor could be as high as 10 to 1, with attenuation and reflections by the electrical apparatus structure causing further signal losses and ambiguities. Obviously, internal mounting of the acoustic sensors is desirable due to greater sensitivity and discharge location accuracy; however, it is hazardous. Thus, it is apparent that the accuracy of detecting and locating the source of corona discharges within electrical apparatus depends to a large extent upon the strength of the pressure signal received by the acoustic sensors.

It would be desirable to provide improved corona detection means for electrical apparatus which has greater sensitivity and corona discharge location accuracy. It would also be desirable to provide corona detection apparatus which may be inserted into the tank of an electrical apparatus without creating electrical stress problems due to the high voltage associated with such electrical apparatus. It would also be desirable to provide corona detection means for an electrical apparatus which may be permanently installed within such apparatus to thereby act as an incipient fault detector.

SUMMARY OF THE INVENTION

Herein disclosed is new and improved apparatus for detecting and locating corona discharges within a tank of an electrical apparatus. Acoustic wave guides are disposed within the tank of the electrical apparatus, each having one end acoustically coupled to an acoustic sensor, such as a mechanical to electrical transducer, mounted external from the tank and, further, having the other end disposed in proximity with the electrical apparatus. The acoustic waveguides transmit the acoustic emissions from the source of a corona discharge in the electrical apparatus to the acoustic sensors without the attenuation associated with prior art corona detectors utilizing sensors mounted on the external tank wall to detect the pressure wave in the insulating fluid within the tank resulting from a corona discharge. By transmitting the acoustic emissions more efficiently to the acoustic sensors, the detection and location of the source of corona discharges within electrical apparatus is made more accurate. In addition, the acoustic waveguides may be disposed within the tank of an electrical apparatus operating at a high potential without creating electrical stress problems and, further, may be permanently installed within such apparatus to act as incipient fault detectors during the operation of the electrical apparatus.

BRIEF DESCRIPTION OF THE DRAWINGS

Additional features, advantages and other uses of this invention will become more apparent by referring to the following detailed description and drawing in which.

DESCRIPTION OF THE PREFERRED EMBODIMENTS

Throughout the following discussion, identical reference numbers refer to the same component shown in all figures of the drawing.

Figure 1:
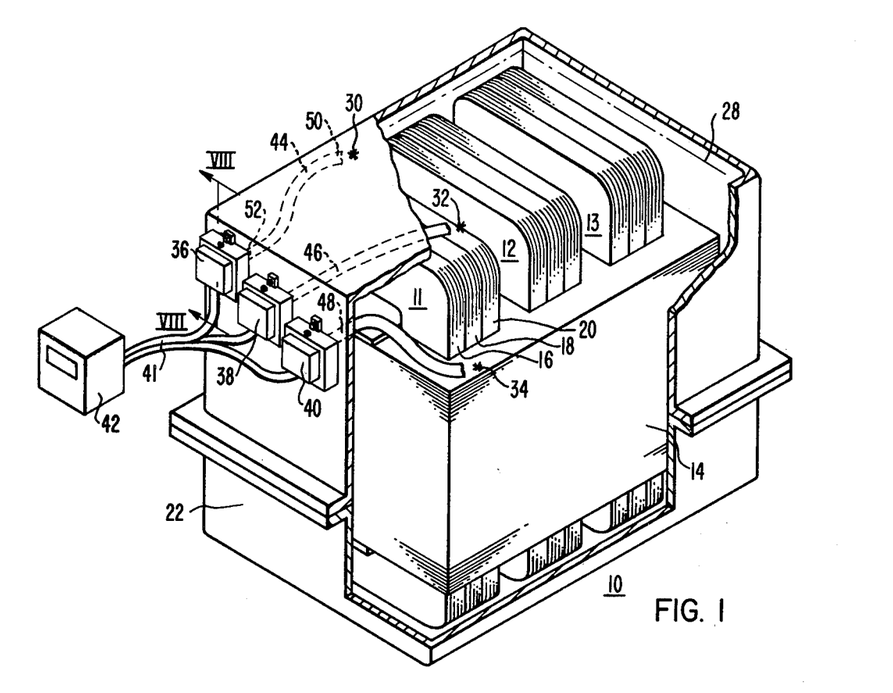
FIG. 1 is an elevational view, partially broken away, of an electrical transformer utilizing corona detection apparatus constructed according to the teachings of this invention.

Referring now to the drawing, and to FIG. 1 in particular, there is shown corona detection apparatus constructed according to one embodiment of this invention for testing a high voltage electrical apparatus, such as an electrical transformer 10. The transformer 10 shown is of the shell-form type and includes phase winding assemblies 11, 12 and 13 which are disposed in inductive relation with a magnetic core 14. Each phase winding, such as phase winding 11, consists of a high voltage winding 18 which is disposed between low voltage windings 16 and 20. The phase windings 11, 12 and 13 and the magnetic core 14 are disposed within a suitable tank 22 which is filled to a level, indicated by reference number 28, with a suitable insulating fluid, such as mineral oil.

Although a three phase, shell-form type transformer is illustrated, it will be understood that the teachings of this invention are equally applicable to single phase transformers of either the shell or core-form type, electrical reactors, gas insulated substations, large rotating apparatus and other high voltage electrical apparatus susceptible to corona discharges during operation.

In high voltage electrical apparatus, such as electrical transformer 10, corona discharges may occur in several locations. Corona location 30 is positioned between the high voltage winding 18 and the transformer casing 22. Thus, a corona discharge at location 30 is produced by the voltage stress between the high voltage winding 18 and the grounded tank 22. A corona discharge may also occur at position 32 which is produced by the voltage stress between the high voltage winding 18 and the low voltage winding 16. Corona location 34 is adjacent the high voltage winding 18 and may be produced by the voltage stress between the high voltage winding 18 and the grounded magnetic core 14.

As is well known, a corona discharge in a high voltage electrical apparatus produces acoustic emissions or waves which may be detected by suitable acoustic sensors. The sensors 36, 38 and 40, which generally consist of a mechanical to electrical signal transducer, convert the acoustic vibrations to an electrical signal indicative of the corona discharge. According to the preferred embodiment of this invention, the acoustic sensors 36, 38 and 40, include resonant transducers operating near 40 and 80 kHz. in order to detect the frequencies of the acoustic emissions caused by corona discharge within the electrical apparatus 10.

Figure 8:
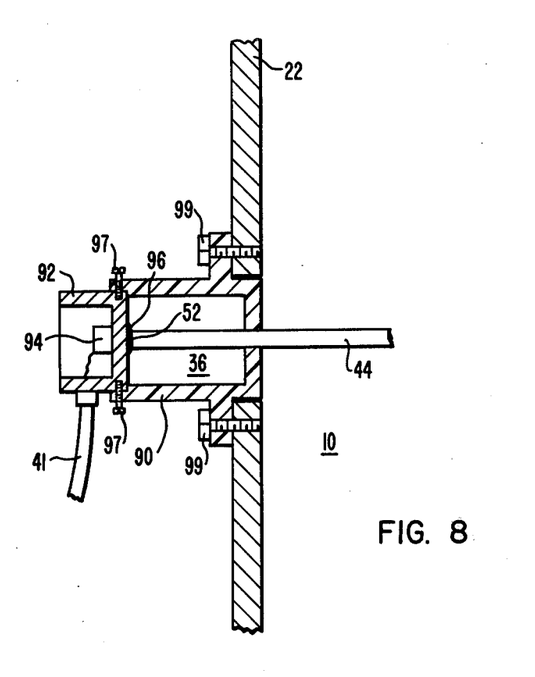
FIG. 8 is a sectional view generally taken along line VIII—VIII in FIG. 1.

As shown more clearly in FIG. 8, the acoustic sensors, such as sensor 36, comprises a piezoceramic sensor 94 which can be responsive to a single frequency, such as 80 kHz., or it may be of the broadband type, such as one responsive to a range of frequencies from 1 kHz. to 10 MHz. In either case, the piezoceramic sensor 94 is mounted in a housing 92 which is secured by suitable means, such as lock screws 97, to a support fixture 90. The support fixture 90, which is formed of a suitable substance, such as butyl rubber, acoustically isolates the piezoceramic sensor 94 and the housing 92 from the tank 22 of the electrical apparatus 10 in order to prevent the acoustic emissions transmitted through the waveguide 44 from being attenuated by the tank wall 22. The support fixture is disposed in an opening in the tank 22 of the electrical apparatus 10 and is held in sealed relation therewith by suitable gaskets, not shown, and bolts 99. The acoustic waveguide is brought through an opening in the support fixture 90. It has an end 52 connected to the piezoceramic housing 92 by suitable connecting means, such as epoxy cement indicated by reference number 96, which provides good acoustic contact between the acoustic waveguide 44 and the piezoceramic housing 92 and sensor 94 disposed therein. The electrical output from the piezoceramic sensor 94 is carried through a conductor, such as co-axial cable 41, to suitable signal detection apparatus described hereafter.

Although the acoustic sensor 36 is illustrated as being mounted on the tank wall of the electrical apparatus 10, it may be mounted at any other remote location, to include a support fixture completely separate and external from the tank 22 of the electrical apparatus 10, as well.

It is also contemplated that suitable narrowband or broadband signal detection instrumentation 42 be connected to the acoustic sensors 36, 38 and 40 in order to detect and locate the source of the corona discharge within the electrical transformer 10. The instrumentation 42 may consist of a cathode ray oscilloscope which, by triggering the oscilloscope with an electrical pulse from the corona discharge, enables the transmit time of the acoustic wave from the source of the corona discharge to the acoustic sensor to be measured. In addition, narrowband instrumentation may include a radio noise meter to detect the magnitude of the corona discharge.

As is well known to those skilled in the art, the pressure level of the acoustic wave resulting from a corona discharge in a fluid-filled electrical apparatus varies inversely in proportion to the distance from the source of the corona discharge. This attenuation or reduction in signal strength in addition to that caused by the tank wall hinders the accurate detection and location of corona discharges within fluid-filled electrical apparatus. In order to improve the sensitivity of the acoustic sensors and thereby accurately detect and locate the source of corona discharges, acoustic waveguides are disposed within the tank of the electrical apparatus to transmit the acoustic emissions from a source of corona discharge to the acoustic sensors mounted at a remote location. Accordingly, there is shown in FIG. 1 acoustic waveguides 44, 46 and 48 which transmit the acoustic emissions resulting from a corona discharge at corona locations 30, 32 and 34 to the acoustic sensors 36, 38 and 40, respectively.

Several properties of the material used to form acoustic waveguides must be considered in choosing the appropriate material for use in an electrical apparatus. Acoustic transmission through acoustic waveguides formed of cylindrical rods is best achieved when Poisson's ratio ($\sigma$) (the ratio of the change in diameter to the change in length of a longitudinally stressed rod) of the rod material is less than 0.26, since at certain angles of incidence at the rod's inner surface, longitudinal waves are completely converted to shear waves and vice versa, so that less wave attenuation occurs along the rod. Some approximate values of Poisson ratio for different materials are listed in Table I, and it can be seen that quartz glass, pyrex glass, zinc and especially beryllium (toxic material), are attractive materials for acoustic waveguides.

TABLE I
ACOUSTIC PROPERTIES OF WAVEGUIDE MATERIALS

| Material | Density($\rho$) gm/cc | Longitudinal Wave Velocity(c) m/sec | Acoustic Impedance $pc \times 10^6$ gm/cm²/sec | Approx. Poisson's Ratio ($\sigma$) |
|---|---|---|---|---|
| Steel | 7.7 | 5,880 | 4.53 | 0.32 |
| Extra Dense Flint Glass | 6.1 | ~4,000 | 2.40 | 0.22–0.26 |
| Pyrex Glass | 3.0 | ~5,000 | 1.50 | 0.16–0.24 |
| Quartz Glass | 2.6 | ~6,000 | 1.20 | 0.17 |
| Beryllium | 1.8 | ~11,000 | 1.98 | 0.05 |
| Plexiglas | 1.2 | ~2,680 | 0.32 | 0.4 |
| Mineral Oil | 0.9 | ~1,390 | 0.128 | |
| Air | 0.0012 | 330 | 0.00004 | |
| Zinc | 7.1 | ~3,810 | 2.7 | 0.21–0.25 |
| Copper | 8.9 | ~3,790 | 3.37 | 0.26 |
| Epoxy-fiberglass | | ~4,600 | | |
| Balsa Wood | 0.12–0.2 (dry) | ~3,750 | 0.06 | |
| Sulphur-Hexafluoride (SF$_6$) | 0.0066 | 140 | 0.000092 | |

Where tubes are used as acoustic waveguides, an important property for efficient acoustic transmission is the acoustic impedance (product of the wave velocity in a material and the material density) of the material, and its relation to the acoustic impedance of the medium in which it operates. This is important because acoustic emissions will pass without loss from one medium to another if they have similar acoustic impedances; but there is considerable acoustic reflection at the medium interface if their acoustic impedances are mismatched.

TABLE II
COMPARISON OF WAVEGUIDE ULTRASOUND TRANSMISSION AT 80 kHz
(Relative to transmission of pyrex glass rod)

| 0.50 in. (12.7 mm) Diameter Rod Waveguides | Relative Transmission | Medium |
|---|---|---|
| Pyrex Glass | 1.000 | Mineral Oil |
| Steel | 0.375 | Mineral Oil |
| Fiberglass | 0.350 | Mineral Oil |
| Plexiglas | 0.060 | Mineral Oil |

| 0.50 in. (12.7 mm) I.D. Tube Waveguides | Relative Transmission | Medium |
|---|---|---|
| Steel | 0.500 | Mineral Oil |
| Lead Glass | 0.105 | Mineral Oil |
| Pyrex Glass | 0.090 | Mineral Oil |
| Plexiglas | 0.083 | Mineral Oil |
| Concentric Plexiglas Tubes with Air Barrier | 0.068 | Mineral Oil |
| 0.5 in. (1.27 cm) Diameter Pyrex Glass Rod | 1.000 | Air or Mineral Oil |
| 0.25 in. (0.635 cm) Diam. Fiberglass Light Guide with 5880 Fibers | 0.870 | Air or Mineral Oil |
| 0.125 in. (0.317 cm) Diam. Fiberglass/Epoxy Rod | 1.000 | Air or |

From Tables I and II, for example, it is evident that Plexiglas and air are considerably mismatched; consequently, acoustic emissions transmitted within a Plexiglas tube disposed in air will stay inside. On the other hand, with a Plexiglas tube disposed in mineral oil, acoustic waves will tend to leave the tube through the walls because the acoustic impedances of mineral oil and Plexiglas are somewhat similar. In mineral oil, it is obvious that a steel tube, for example, will be a better acoustic waveguide because the acoustic impedances of mineral oil and steel are substantially mismatched.

In addition to the type of material and the varying mediums in which the acoustic waveguides are disposed, the size of the waveguide is another important factor in determining efficient transmission of certain acoustic frequencies. The effects of varying waveguide size on acoustic transmission is graphically shown in FIGS. 2 through 6 in the form of ratios of ultrasound received with waveguides/ultrasound received without waveguides versus the distance in air or mineral oil from the source of a corona discharge. Whenever this ratio is greater than unity, that is, the ultrasound received with the waveguide has a higher magnitude than the ultrasound received without the waveguide, it is worthwhile to use that acoustic waveguide.

Figure 2:
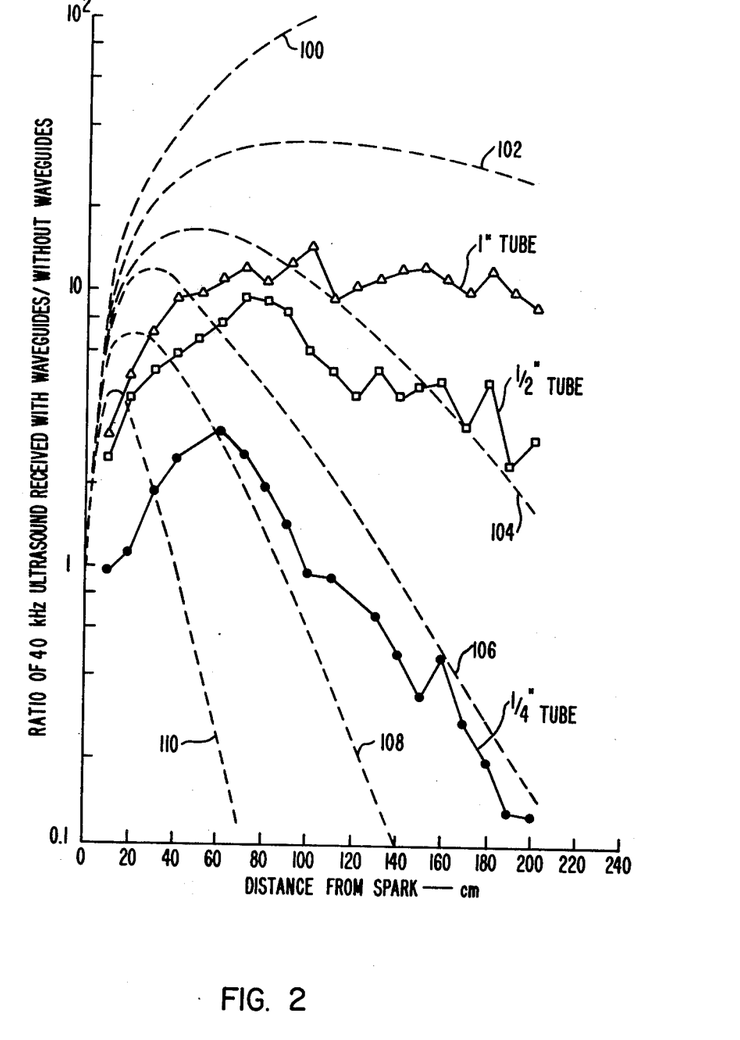
FIG. 2 is a chart illustrating the ratios of 40 kHz. ultrasonic emissions received versus distance from the source for different acoustic waveguides in air.
Figure 3:
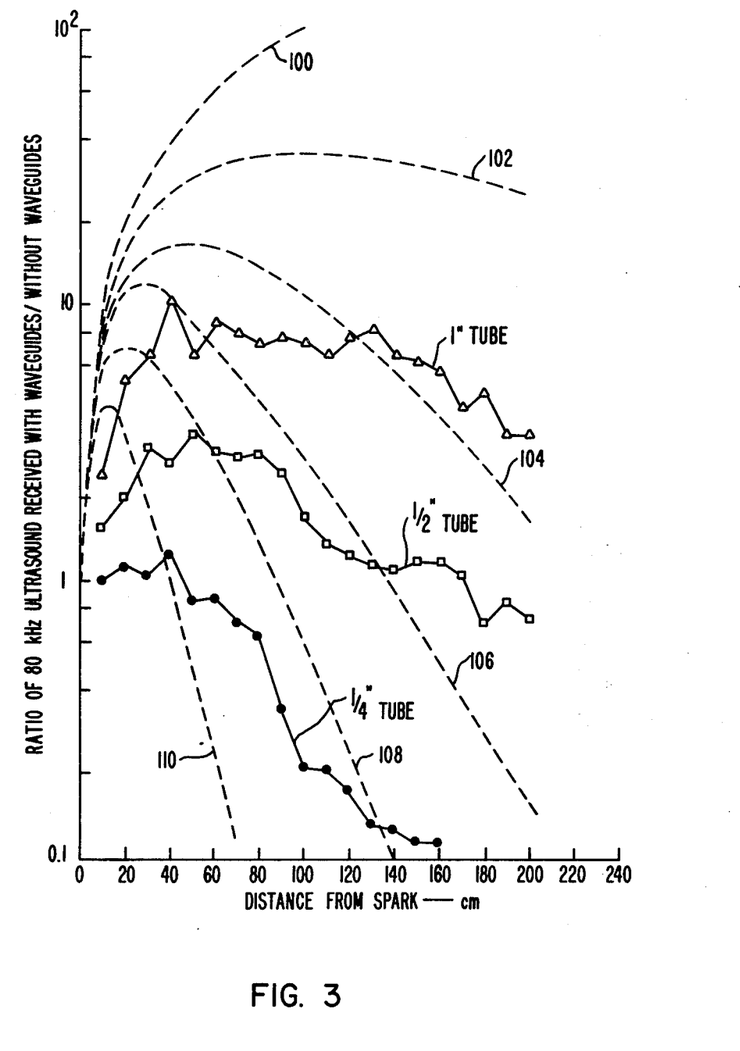
FIG. 3 is a chart illustrating the ratios of 80 kHz. ultrasonic emissions received versus distance from the source for different acoustic waveguides in air.

FIGS. 2 and 3 illustrate the ratios of 40 kHz. and 80 kHz. acoustic emissions received with and without waveguides versus the distance from the spark in air using different diameter Plexiglas tubes. As seen in FIG. 2, at a distance of 200 cm from an air spark, the use of a 1.0 inch I.D. Plexiglas tube increased the 40 kHz. ultrasound level approximately ten times. On the other hand, a 200 cm long, ¼ inch I.D. tube resulted in a 10 to 1 reduction in received signal, and consequently, would not be too valuable for corona discharge detection. The curves 100, 102, 104, 106, 108 and 110 marked with the dashed lines are calculated ratio values assuming different ultrasonic attenuation factors along the waveguides. In FIGS. 2 through 6, the curves 100, 102, 104, 106, 108 and 110 are calculated using attenuation factors equal to 1.0, 0.9, 0.8, 0.7, 0.6 and 0.4, respectively, which correspond to a decrease in dB/10 cm of 0, 1.0, 2.0, 3.0, 4.5 and 8.0, respectively, along a waveguide. The results of ultrasonic measurements from corona discharges in air shown in FIGS. 2 and 3 indicate that the larger diameter tubes act as more efficient waveguides, with a 1.0 inch Plexiglas tube having a gain of approximately 10 at 200 cm from the source of the corona discharge.

Figure 4:
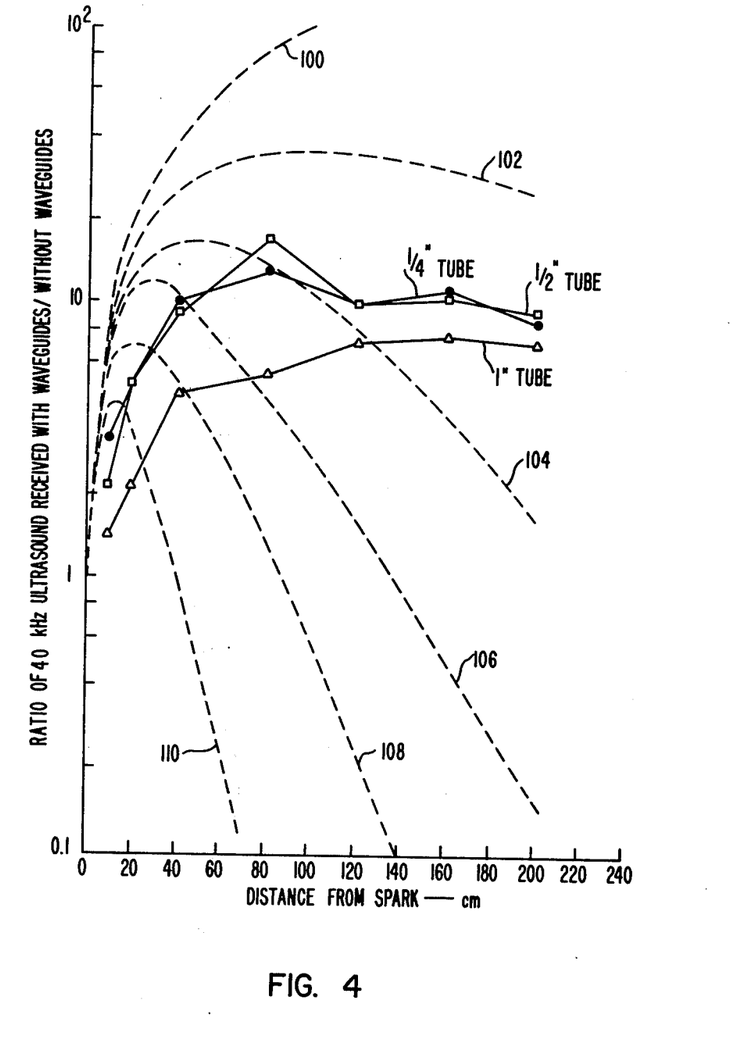
FIG. 4 is a chart illustrating the ratios of 40 kHz. ultrasonic emissions received versus distance from the source for different acoustic waveguides in mineral oil.
Figure 5:
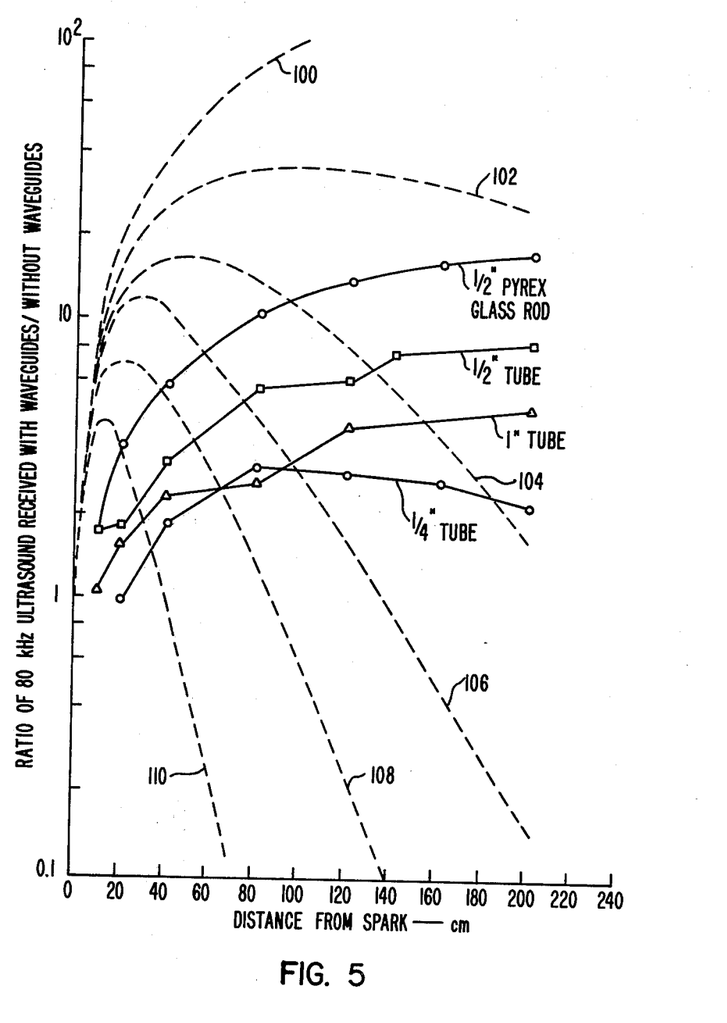
FIG. 5 is a chart illustrating the ratios of 80 kHz. ultrasonic emissions versus received distance from the source for different acoustic waveguides in mineral oil.

In contrast to the data taken in air, the measurements from corona discharges in mineral oil, shown in FIGS. 4 and 5, indicate that a ½ inch I.D. steel tube is very efficient as an acoustic waveguide and at 200 cm, gains of 10 at 40 kHz. and 9 at 80 kHz. were obtained. Also a 1 inch steel tube was not as efficient an acoustic guide as a ¼ inch steel tube.

Figure 6:
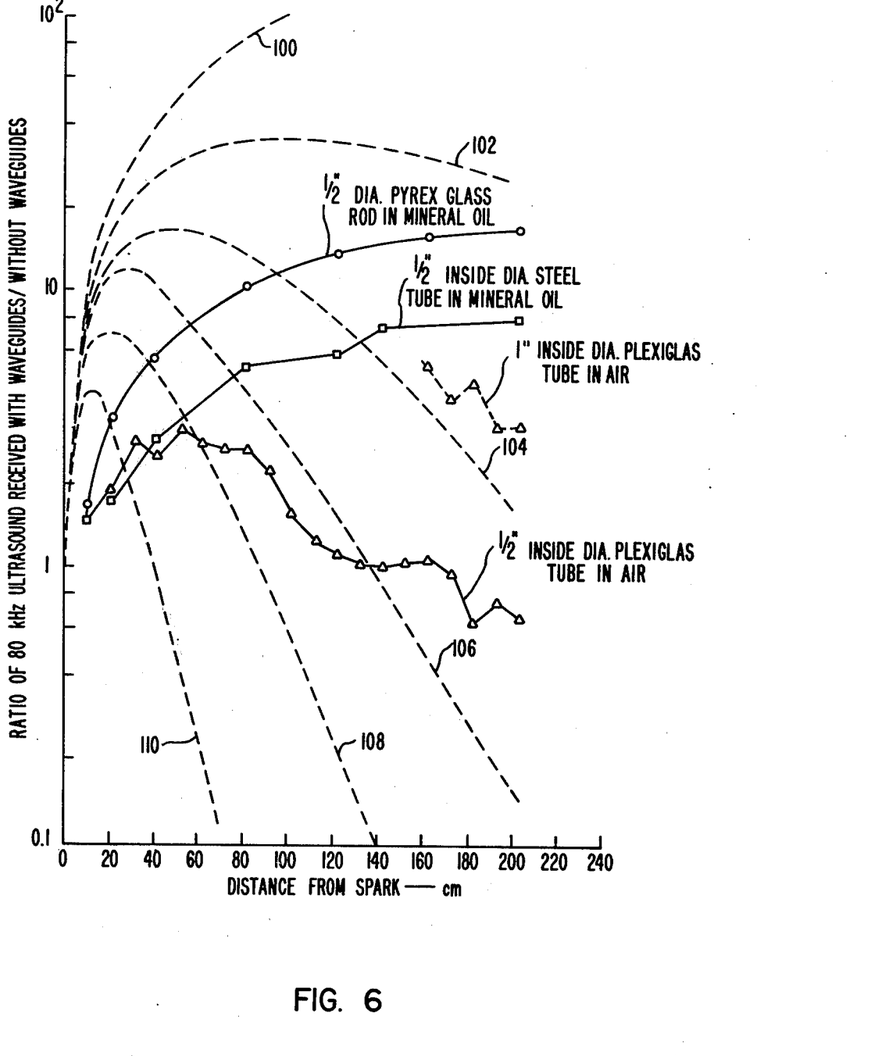
FIG. 6 is a chart illustrating the ratios of 80 kHz. ultrasonic emissions received versus distance from the source for different acoustic waveguides in oil and air.

A very efficient acoustic waveguide for use in mineral oil, which does not have the electrical stress problems of a steel tube, was found to be a ½ inch diameter pyrex glass rod which, at 200 cm, provided a gain of 17 at 80 kHz. as shown in FIG. 5. In FIG. 6, the performance of the ½ inch diameter pyrex glass rod is compared with that of a ½ inch diameter steel tube in mineral oil and ½ inch and 1 inch Plexiglas tubes in air; while in Table III, a comparison is made between the attenuation of 80 kHz. acoustic transmission in various rods and tubes.

TABLE III

ATTENUATION OF ULTRASOUND IN WAVEGUIDES

| Type of Waveguide and Transmission Medium | Approximate Attenuation of Ultrasound (Decibels per meter) | |
|---|---|---|
| | 40 kHz | 80 kHz |
| 0.25 in. (0.635 cm) inside diameter Plexiglas tube in air | 25.5 dB/m | 30 dB/m |
| 0.5 in. (1.27 cm) inside diameter Plexiglas tube in air | 13.5 dB/m | 17.1 dB/m |
| 1.0 in. (2.54 cm) inside diameter Plexiglas tube in air | 8.9 dB/m | 13.5 dB/m |
| 0.25 in. (0.635 cm) inside diameter steel tube in mineral oil | 8.5 dB/m | 10.75 dB/m |
| 0.5 in. (1.27 cm) inside diameter steel tube in mineral oil | 8.5 dB/m | 4.25 dB/m |
| 1.0 in. (2.54 cm) inside diameter steel tube in mineral oil | 6.25 dB/m | 7.25 dB/m |
| 0.5 in. (1.27 cm) diameter pyrex glass rod in mineral oil or air | | 3.0 dB/m |
| 0.125 in. (0.317 cm) diameter fiberglass/epoxy rod in mineral oil or air | | 3.0 dB/m |

Of note here is the poor acoustic transmission of mineral oil immersed Plexiglas rods, and tubes of lead glass, pyrex glass and Plexiglas while the transmission properties of a ¼ inch diameter fiberglass light guide is almost as good as that of a ½ inch diameter pyrex glass rod or a ⅛ inch diameter rod formed of fiberglass reinforced epoxy resin.

Further tests have indicated that the acoustic transmission characteristics of acoustic waveguides, such as a ½ inch diameter pyrex glass rod do not change when the waveguide passes through different mediums, such as from mineral oil to air. In addition, bends in the waveguides do not introduce any significant losses or attenuation in the signal transmitted thereover.

Referring again to FIG. 1, the use of acoustic waveguides formed of the above-described materials to detect and locate the source of corona discharges within the transformer 10 will now be described. Since the acoustic waveguides 44, 46 and 48 are identical, only waveguide 44 will be described in detail hereafter. Accordingly, acoustic waveguide 44 is formed of a longitudinally extending cylindrical member of a suitable material for use as an efficient waveguide in mineral oil, such as a ½ inch diameter pyrex glass rod. The acoustic waveguide 44 has first and second ends 50 and 52, respectively. The first end 50 of the acoustic waveguide 44 is disposed in proximity with a probable location of corona discharge, such as location 30 between the high voltage winding 18 and the tank 22 of the transformer 10. The second end 52 of the acoustic waveguide 44 is acoustically coupled to acoustic sensor 36.

Acoustic emissions or waves resulting from a corona discharge at location 30 will strike the first end 50 of the acoustic waveguide 44 and will be transmitted by the acoustic waveguide 44 through the second end 52 to the acoustic sensor 36 which produces an electrical signal indicative of the corona discharge at location 30 in the transformer 10. This electrical signal will then be analyzed by appropriate instrumentation 42, described above, to detect and pinpoint the exact location of the corona discharge within the transformer 10. Since, in this embodiment, a plurality of acoustic waveguides each associated with a specific location in the transformer 10 are employed, it becomes relatively easy to locate the source of corona discharge since only one specific acoustic waveguide will indicate a corona discharge.

The performance of an acoustic waveguide for sensing corona discharges within high voltage electrical apparatus can be illustrated by comparing it to the conventional corona detection means utilizing acoustic sensors mounted on the tank wall which sense the pressure wave in the insulating fluid resulting from a corona discharge within the tank. If the first or free end of an acoustic waveguide, 2 meters in length and coupled to an acoustic sensor at the other end, is disposed within the tank 22 of the transformer 10 approximately 10 cm from the source of the corona discharge, the 80 kHz. acoustic pressure wave entering the acoustic waveguide would be reduced by 6 dB (2:1), due to attenuation in the waveguide before reaching the sensor 2 meters away at the end of the waveguide. In the conventional corona detection apparatus with the sensor located on the outside of the transformer tank, the acoustic emissions from the corona discharge would reduce in pressure level by 10 to 1 on reaching the tank wall due to diffusion, and may reduce a further 10 to 1 in passing through the steel wall to the acoustic sensor. Thus, in this example, the acoustic waveguide improved the sensor response by 50 times.

According to the preferred embodiment of this invention, the acoustic waveguides described above may be used in two different situations to detect corona discharges within a high voltage electrical apparatus, such as transformer 10. The acoustic waveguide having an acoustic sensor coupled to one end may be inserted as a probe inside the transformer to locate corona discharges during initial testing of the transformer 10. In addition, since certain acoustic waveguide materials, such as epoxy-fiberglass or pyrex glass rods, have dielectric constants comparable to that of the insulating fluid within the tank, acoustic waveguides formed of these materials may be permanently installed within the tank of a fluid-filled high voltage electrical apparatus to act as an incipient fault detector throughout the lifetime of the electrical apparatus. Furthermore, the use of fiber optic light guides, as indicated in Table II, may be used to transmit acoustic emissions and, also, light emissions from the source of corona discharges within electrical apparatus to provide additional detection capability of corona discharges.

The above discussion shows that certain waveguide materials and configurations transmit a particular frequency of acoustic waves more efficiently than others. This permits many variations in the use of acoustic waveguides in detecting corona discharges in electrical apparatus. For example, a plurality of waveguides may be used with each designed to transmit a particular frequency of acoustic waves. This, a waveguide formed of a 3 mm epoxy/fiberglass rod could be used to detect 80 kHz. acoustic emissions; while a ½ in. pyrex glass rod would detect 40 kHz. emissions. In addition, each acoustic waveguide may be coupled to an individual acoustic sensor adapted to receive a single frequency or all of the waveguides can be coupled to a single wideband sensor which detects a wide range of frequencies. In this manner, a wide range of frequencies of acoustic emissions, from 1 kHz. to at least 10 MHz, can be detected which further improves the detection and location of corona discharges within electrical apparatus.

Figure 7:
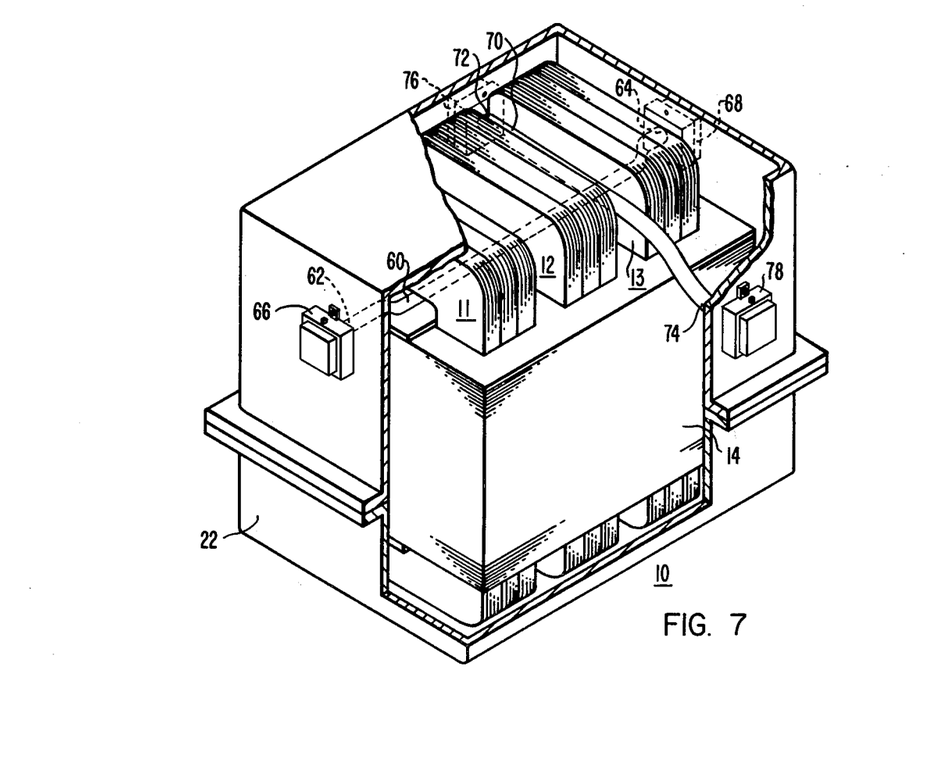
FIG. 7 is an elevational view, partially broken away, of an electrical apparatus having corona detection apparatus constructed according to another embodiment of this invention.

Referring now to FIG. 7, there is shown an electrical apparatus, such as a transformer 10, having corona detection means constructed according to another embodiment of this invention. In this embodiment, first and second acoustic waveguides 60 and 70, respectively, are disposed within the tank 22 of the transformer 10. Each waveguide 60 and 70 has first and second ends, such as ends 62 and 64 for the first acoustic waveguide 60 and ends 72 and 74 of the second acoustic waveguide 70, which are connected to acoustic sensors 66, 68, 76 and 78, respectively. In addition, each waveguide 60 and 70 is continuous between its respective first and second ends and is disposed in proximity with the transformer 10 to thereby monitor the transformer 10 for sources of corona discharge.

It has been unexpectedly discovered that a single continuous acoustic waveguide can receive acoustic waves which impinge on its surface anywhere along its length and transmit these acoustic waves to sensors located at each end thereof. In the past, acoustic waveguides have been employed such that the source of acoustic waves would inpinge substantially perpendicular on one end of the acoustic waveguide. By acoustically coupling sensors to each end of a continuous acoustic waveguide, acoustic waves impinging upon the surface of the acoustic waveguide from a source of corona discharge will be transmitted by the acoustic waveguide to each of the sensors coupled to the respective ends of the acoustic waveguide. If the source of corona discharge is located near the center of the acoustic waveguide, there will be no difference in the transit time of the acoustic waves to the respective waveguide terminals and acoustic sensors coupled thereto. However, when the source of corona discharge is closer to one end of the acoustic waveguide, a significant difference in transit time occurs. The exact location of the source of corona discharge within an electrical apparatus may be determined by measuring the time difference between the arrival of acoustic signals at each end or terminal of the acoustic waveguide. The distance along the waveguide at which the source of corona discharge is closest can be estimated from the following formula:

$$X = (l - tv)/2$$

where: $l$ is the waveguide length in cm, $t$ is the time difference between the arrival of the acoustic signals at each terminal of the waveguide and $v$ is the velocity of acoustic waves in the waveguide material. An alternative way of determining the time difference ($t$) is to use the first arriving acoustic signal to trigger an oscilloscope. Furthermore, the location of the source of corona discharge at which the acoustic waves first enters the acoustic waveguide can be calculated by noting the magnitude of the acoustic signals at each waveguide end and using the waveguide attenuation.

It is believed that the reason why a single waveguide will receive and transmit acoustic waves impinging anywhere along its surface is because the velocity of acoustic waves in an acoustic waveguide formed of epoxy-fiberglass, for example, is higher (4600 m/sec) than in mineral oil (1300 m/sec), and consequently, acoustic waves striking a portion of acoustic waveguide will travel down it to the respective terminals before the waves impinge upon the remainder of the waveguide.

Although the continuous acoustic waveguides 60 and 70 are illustrated in FIG. 7 as being relatively straight, they may also be bent into any desired configuration without affecting the transmission of acoustic waves thereover. Thus, one continuous acoustic waveguide may be intertwined throughout the structure of the transformer 10 to monitor a plurality of critical areas for corona discharges, which thereby reduces the number of acoustic sensors required to detect corona discharges throughout the transformer 10.

It will be apparent to one skilled in the art that there has been herein disclosed a new and improved apparatus for detecting and locating corona discharges in high voltage electrical apparatus. Acoustic waveguides formed of suitable material are disposed within the tank in proximity with the electrical apparatus to transmit acoustic waves from the source of corona discharge to remote acoustic sensors. The acoustic waveguides transmit the pressure wave produced by the corona discharge to the acoustic sensors without the significant attenuation in signal strength that is common with prior art corona detection apparatus. This, therefore, significantly increases the sensitivity of the acoustic sensors and provides greater detection and locating capabilities of corona discharges within high voltage electrical apparatus. In addition, the acoustic waveguides may be permanently installed within the electrical apparatus to thereby act as incipient fault detectors throughout the normal life of the apparatus.

What is claimed is:

1. Apparatus for detecting and locating acoustic emissions from a source of corona discharge in electrical apparatus, comprising:

a tank containing an insulating fluid, electrical apparatus disposed within said tank, acoustic waveguide means, at least a portion of said waveguide means being disposed within said tank, adjacent to said electrical apparatus, sensor means outside said tank, and coupling means acoustically coupling said acoustic waveguide means and said sensor means through said tank, while acoustically isolating said acoustic waveguide means from said tank, said sensor means providing a corona responsive signal in response to corona discharge initiated acoustic emissions in said electrical apparatus, which are transmitted to said sensor means via said waveguide means.

2. The corona detection apparatus of claim 1 wherein the acoustic waveguide means comprises a longitudinally extending member having first and second ends, with its first end being disposed in proximity with the electrical apparatus, and its second end being acoustically coupled to the sensor means by the coupling means.

3. The corona detection apparatus of claim 1 wherein the acoustic impedance of the acoustic waveguide means is greater than the acoustic impedance of the insulating fluid, such that at least a portion of the acoustic emissions striking the acoustic waveguide means will enter and remain within the acoustic waveguide means while being transmitted therealong without significant attenuation.

4. The corona detection apparatus of claim 1 wherein the acoustic waveguide means has a Poisson's ratio of less than 0.26.

5. The corona detection apparatus of claim 1 wherein the insulating fluid disposed within the tank is mineral oil.

6. The corona detection apparatus of claim 1 wherein the acoustic waveguide means comprises a pyrex glass rod having a diamter of approximately 0.50 inches.

7. The corona detection apparatus of claim 1 wherein the acoustic waveguide means comprises a longitudinally extending rod having a diameter of approximately 0.125 inches and fabricated of fiberglass refinforced epoxy resin.

8. The corona detection apparatus of claim 1 wherein the acoustic waveguide means is formed of a light transmitting member.

9. Electrical apparatus comprising:
a tank;
an electrical winding operative at a high voltage disposed within said tank, with the high voltage producing an electrical stress, in response to an abnormal condition, which may initiate corona and associated acoustic emissions;
an insulating liquid disposed within said tank and surrounding said electrical winding;
an acoustic waveguide, having first and second ends, with said first end being disposed in said tank, in proximity with said electrical winding;
an acoustic sensor mounted externally from said tank;
and coupling means acoustically coupling the second end of said acoustic waveguide to said acoustic sensor, while acoustically isolating said acoustic waveguide from said tank;
said acoustic waveguide transmitting acoustic emissions from a source of corona discharge within said tank to said acoustic sensor;
said acoustic sensor providing a signal in response to said transmitted acoustic transmissions.

10. A method for detecting a source of corona discharge in an electrical apparatus disposed in a tank comprising the steps of:
providing an acoustic waveguide having first and second ends and adapted to transmit acoustic emissions;
providing an acoustic sensor,
disposing the second end of the acoustic waveguide in the tank, in proximity to the electrical apparatus,
disposing the acoustic sensor outside the tank,
coupling the acoustic sensor to the first end of the acoustic waveguide through the tank; and
isolating the acoustic waveguide from the tank such that acoustic emissions from a source of corona discharge in the electrical apparatus will enter the second end of the acoustic waveguide and be transmitted to the acoustic sensor with little attenuation thereof due to the tank.

* * * * *